US009129706B2

(12) United States Patent
Shankar et al.

(10) Patent No.: US 9,129,706 B2
(45) Date of Patent: Sep. 8, 2015

(54) DUMMY READ TO PREVENT CROWBAR CURRENT DURING READ-WRITE COLLISIONS IN MEMORY ARRAYS WITH CROSSCOUPLED KEEPERS

(71) Applicant: QUALCOMM Incorporated, San Diego, CA (US)

(72) Inventors: Harish Shankar, Raleigh, NC (US); David Paul Hoff, Raleigh, NC (US); Manish Garg, Morrisville, NC (US)

(73) Assignee: QUALCOMM Incorporated, San Diego, CA (US)

( * ) Notice: Subject to any disclaimer, the term of this patent is extended or adjusted under 35 U.S.C. 154(b) by 103 days.

(21) Appl. No.: 13/787,875

(22) Filed: Mar. 7, 2013

(65) Prior Publication Data

US 2014/0119102 A1 May 1, 2014

Related U.S. Application Data

(60) Provisional application No. 61/720,420, filed on Oct. 31, 2012.

(51) Int. Cl.
| | |
|---|---|
| *G11C 11/412* | (2006.01) |
| *G11C 5/06* | (2006.01) |
| *G11C 8/16* | (2006.01) |
| *G11C 8/00* | (2006.01) |
| *G11C 8/08* | (2006.01) |
| *G11C 11/413* | (2006.01) |
| *G11C 11/418* | (2006.01) |

(52) U.S. Cl.
CPC .............. *G11C 11/412* (2013.01); *G11C 5/063* (2013.01); *G11C 8/08* (2013.01); *G11C 8/16* (2013.01); *G11C 11/413* (2013.01); *G11C 11/418* (2013.01)

(58) Field of Classification Search
CPC .............. G11C 5/06; G11C 8/16; G11C 8/00; G11C 11/412
USPC ................................................ 365/72, 154, 12
See application file for complete search history.

(56) References Cited

U.S. PATENT DOCUMENTS

| | | | | |
|---|---|---|---|---|
| 5,062,081 A | * | 10/1991 | Runaldue | 365/230.05 |
| 8,208,316 B2 | * | 6/2012 | Chen et al. | 365/189.07 |
| 2010/0232202 A1 | * | 9/2010 | Lu et al. | 365/72 |
| 2011/0228594 A1 | * | 9/2011 | Rao et al. | 365/158 |
| 2011/0264853 A1 | | 10/2011 | Tanaka | |

FOREIGN PATENT DOCUMENTS

| | | |
|---|---|---|
| CN | 101043289 | 9/2007 |
| JP | 61151900 | 7/1986 |
| JP | 2000293435 | 10/2000 |

OTHER PUBLICATIONS

International Search Report and Written Opinion—PCT/US2013/067193—ISA/EPO—Feb. 26, 2014.

* cited by examiner

*Primary Examiner* — Huan Hoang
*Assistant Examiner* — Muna Techane
(74) *Attorney, Agent, or Firm* — Paul S. Holdaway

(57) ABSTRACT

Systems and methods for detecting and suppressing crowbar currents in memory arrays. A dummy read is implemented to prevent crowbar currents in the case of simultaneous read-write collisions in a static random access memory (SRAM) array having cross-coupled bitline keepers. When a simultaneous read and write operation to a first entry of the memory array is detected, the read operation to the first entry is suppressed and a dummy read operation to a second entry of the memory array is performed. The write operation to the first entry is allowed to proceed undisturbed.

17 Claims, 7 Drawing Sheets

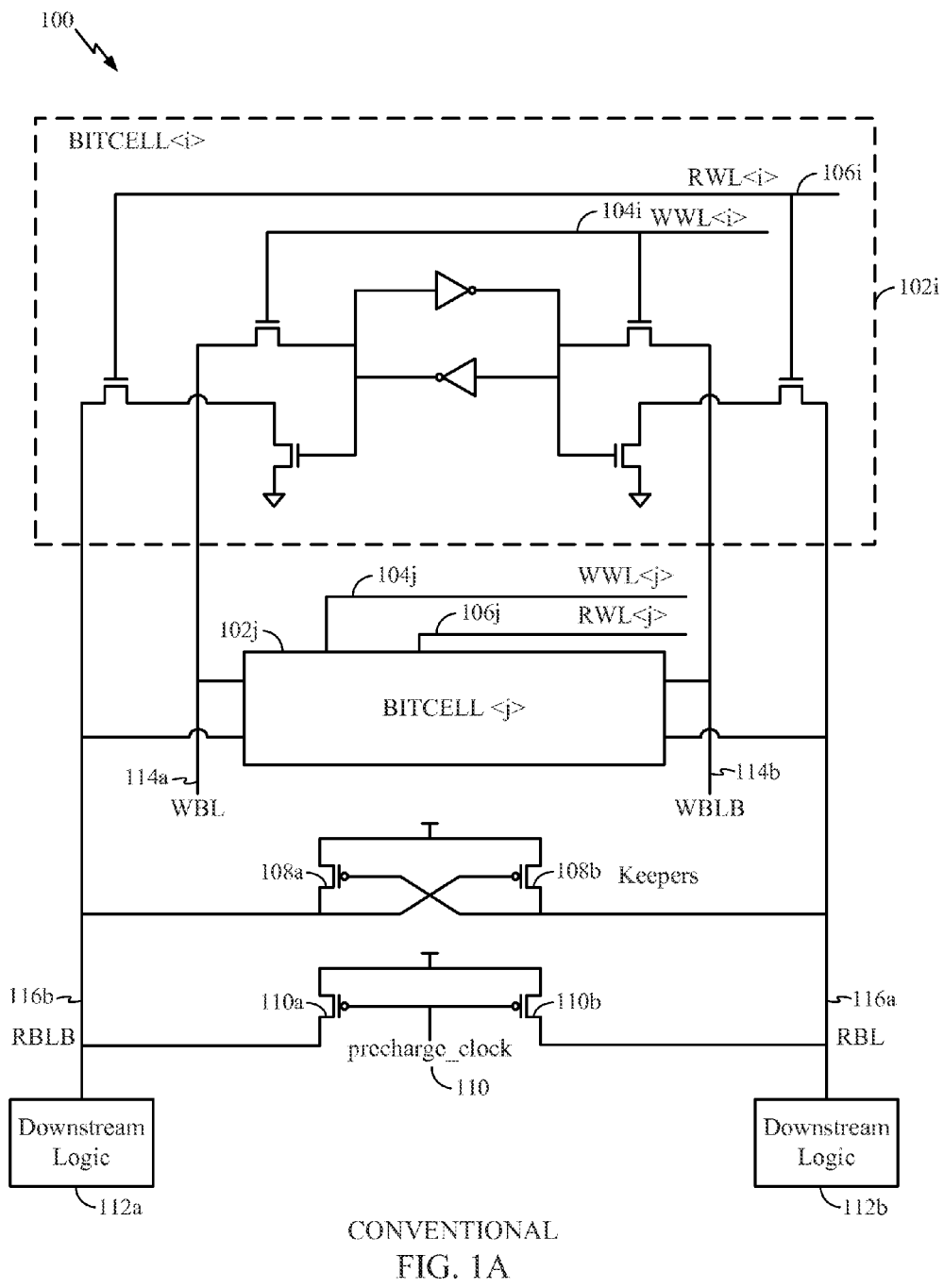
CONVENTIONAL
FIG. 1A

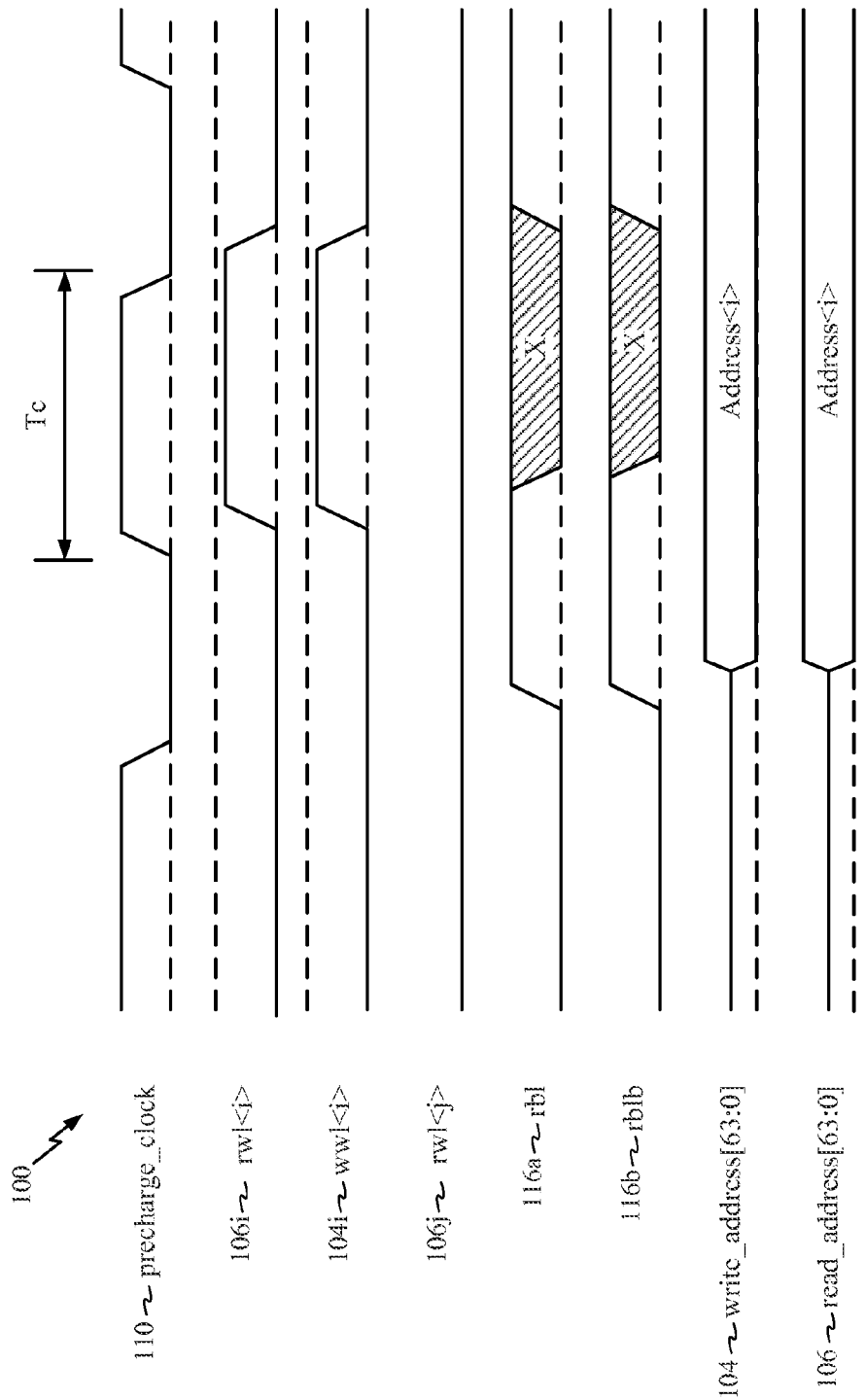
CONVENTIONAL
FIG. 1B

DUMMY READ TO PREVENT CROWBAR CURRENT DURING READ-WRITE COLLISIONS IN MEMORY ARRAYS WITH CROSSCOUPLED KEEPERS

CLAIM OF PRIORITY UNDER 35 U.S.C., §119

The present Application for Patent claims priority to Provisional Application No. 61/720,420 entitled "DUMMY READ TO PREVENT CROWBAR CURRENT DURING READ-WRITE COLLISIONS IN MEMORY ARRAYS WITH CROSS-COUPLED KEEPERS" filed Oct. 31, 2012, and assigned to the assignee hereof and hereby expressly incorporated by reference herein.

FIELD OF DISCLOSURE

Disclosed embodiments are directed to managing and preventing crowbar currents in memory arrays. More particularly, exemplary embodiments are directed to preventing crowbar currents arising from read-write collisions in memory arrays, such as, static random access memory (SRAM), which include cross-coupled bitline keepers, by performing a dummy read operation.

BACKGROUND

Some processors may allow simultaneous read and write operations to be performed on a memory structure such as a cache, in order to increase the number of instructions processed per cycle. However, hazards may arise when simultaneous read and write operations are scheduled on the same memory entry, such as the same cache line. These hazards may not only result in functional errors, but may also lead to harmful conditions such as crowbar currents, which may cause severe damage to the memory structure. Particularly, for memory structures such as static random access memory (SRAM), when read and write drivers to the same SRAM bit cell are enabled, read/write circuitry such as cross-coupled bitline keepers may be confused by opposing currents, which can give rise to harmful crowbar currents and drive the cross-coupled bitline keepers to a meta-stable state.

An illustration of the above scenario will be provided with respect to FIG. 1A. In FIG. 1A, a conventional fully differential SRAM array 100 is illustrated. SRAM array 100 includes bit cells 102$i$, 102$j$, etc, each configured as a ten transistor (10T) SRAM cell as is known in the art. Write word lines WWL 104$i$ and WWL 104$j$ are enabled (i.e. driven to a high voltage level or logic state) for write operations on corresponding bit cells 102$i$ and 102$j$. The data to be written is supplied by complementary write bitlines WBL 114$a$ and WBLB 114$b$. Similarly, read word lines RWL 106$i$ and RWL 106$j$ are enabled for read operations on corresponding bit cells 102$i$ and 102$j$), and the read data is read out of the corresponding bit cells on complementary read bitlines RBL 116$a$ and RBLB 116$b$. Transistors 110$a$-$b$ are used to provide pre-charge clock 110 to SRAM array 100. Cross-coupled bitline keepers 108$a$ and 108$b$ are provided to accelerate the operations on the bit cells. For example, to enable faster reading of bit cells during operations such as tag compares, cross-coupled bitline keepers 108$a$-$b$ are provided, to mitigate delays in the critical path. However, when simultaneous read and write operations are allowed to take place on the same bit cell, for example, bit cell 102$i$ by enabling both WWL 104$i$ and RWL 106$i$, cross-coupled bitline keepers 108$a$-$b$ are driven to a meta-stable state and complementary read bitlines RBL 116$a$ and RBLB 116$b$ are caused to float. This creates a harmful and undesirable crowbar for short-circuit) current to flow through downstream logic 112$a$-$b$. Downstream logic 112$a$-$b$ can include any logic, circuitry, or buses which can be internal or external to SRAM array 100, and it is important to protect downstream logic 112$a$-$b$ from frequent and potentially irreparable damage which can be caused from the crowbar current.

Existing techniques to prevent crowbar current arising from simultaneous or clashing read and write operations on the same bit cell, include preventing one of the read or the write operations from taking place, in the absence of a write buffer, the write operation cannot be prevented, or otherwise there is a risk of permanently losing the data which was meant to be written. Therefore, in conventional techniques, the read operation is prevented, for example, by suppressing read word line RWL 106$i$ from being enabled or driven to a high state when WWL 104$i$ and RWL 106$i$ are likely to conflict. However, RWL 106$i$ cannot be simply prevented from being enabled because doing so may cause complementary bitlines RBL 116$a$ and RBLB 116$b$ to float. Since complementary bitlines RBL 116$a$ and RBLB 116$b$ are required to be evaluated to complementary logic states when the read circuitry is activated, causing them to float may nevertheless give rise to crowbar current.

Alternative approaches to avoiding the above-described problem include detecting the problematic simultaneous read-write situation well in advance, and sidestepping the problem, for example, by implementing a software fix. For example, the instructions being executed on a processor associated with the memory structure can be reordered to avoid read-write collision hazards. However, such detection and collision prevention in software is not feasible or is impractical because a programmer may not have sufficient visibility into the physical memory locations and/or may lack control over read/write operations as they perform to real time applications. Moreover, software intervention on this level may severely slow down high performance processing applications. The problem is further complicated when multiple processors share the same memory structure. Existing approaches often rely on expensive and inefficient solutions, such as dedicated write buffers, in an attempt to handle situations where read-write collisions may take place. Moreover, to the extent these approaches exist in the general area of handling read-write hazards or collisions, there is continuing need in the art for effectively preventing crowbar currents from arising when a situation does arise in a memory structure, such as a SRAM array, when read and write word lines to a bit cell are simultaneously enabled.

SUMMARY

Exemplary embodiments are directed to managing crowbar currents in memory arrays which employ cross-coupled bitline keepers. For example, some embodiments are directed to implementing a dummy read to prevent crowbar currents in cases of read-write collisions for a memory entry in a memory array which utilizes cross-coupled bitline keepers.

For example, an exemplary embodiment is directed to a method of preventing crowbar current in a static random access memory (SRAM) array comprising cross-coupled bitline keepers, the method comprising: detecting a simultaneous read and write operation to a first entry of the SRAM array, suppressing the read operation to the first entry, and performing a dummy read operation to a second entry of the SRAM array, the first and second entries coupled to the cross-coupled bitline keepers.

Another exemplary embodiment is directed to a static random access memory (SRAM) array comprising: a first bit cell, a second bit cell, and cross-coupled bitline keepers coupled to the first bit cell and the second bit cell. Detection logic is configured to detect a simultaneous read and write operation to the first bit cell and suppression logic is configured to suppress the read operation to the first bit cell if a simultaneous read and write operation to the first bit cell is detected. Further, read logic is configured to perform a dummy read operation to the second bit cell.

Yet another exemplary embodiment is directed to system comprising a static random access memory (SRAM) array comprising a first entry and a second entry, cross-coupled bitline keepers coupled to the first entry and the second entry, means for detecting a simultaneous read and write operation to the first entry, means for suppressing the read operation to the first entry, and means for performing a dummy read operation to the second entry.

Another exemplary embodiment is directed to a non-transitory computer-readable storage medium comprising code, which, when executed by a processor, causes the processor to perform operations for preventing crowbar current in a static random access memory (SRAM) array comprising cross-coupled bitline keepers, the non-transitory computer-readable storage medium comprising: code for detecting a simultaneous read and write operation to a first entry of the SRAM array, code for suppressing the read operation to the first entry, and code for performing a dummy read operation to a second entry of the SRAM array, the first and second entries coupled to the cross-coupled bitline keepers.

BRIEF DESCRIPTION OF THE DRAWINGS

The accompanying drawings are presented to aid in the description of embodiments of the invention and are provided solely for illustration of the embodiments and not limitation thereof.

FIG. 1A is conventional SRAM array with cross-coupled bitline keepers.

FIG. 1B is a timing diagram corresponding to a read-write collision in the conventional SRAM array of FIG. 1.

DETAILED DESCRIPTION

Figure 2:
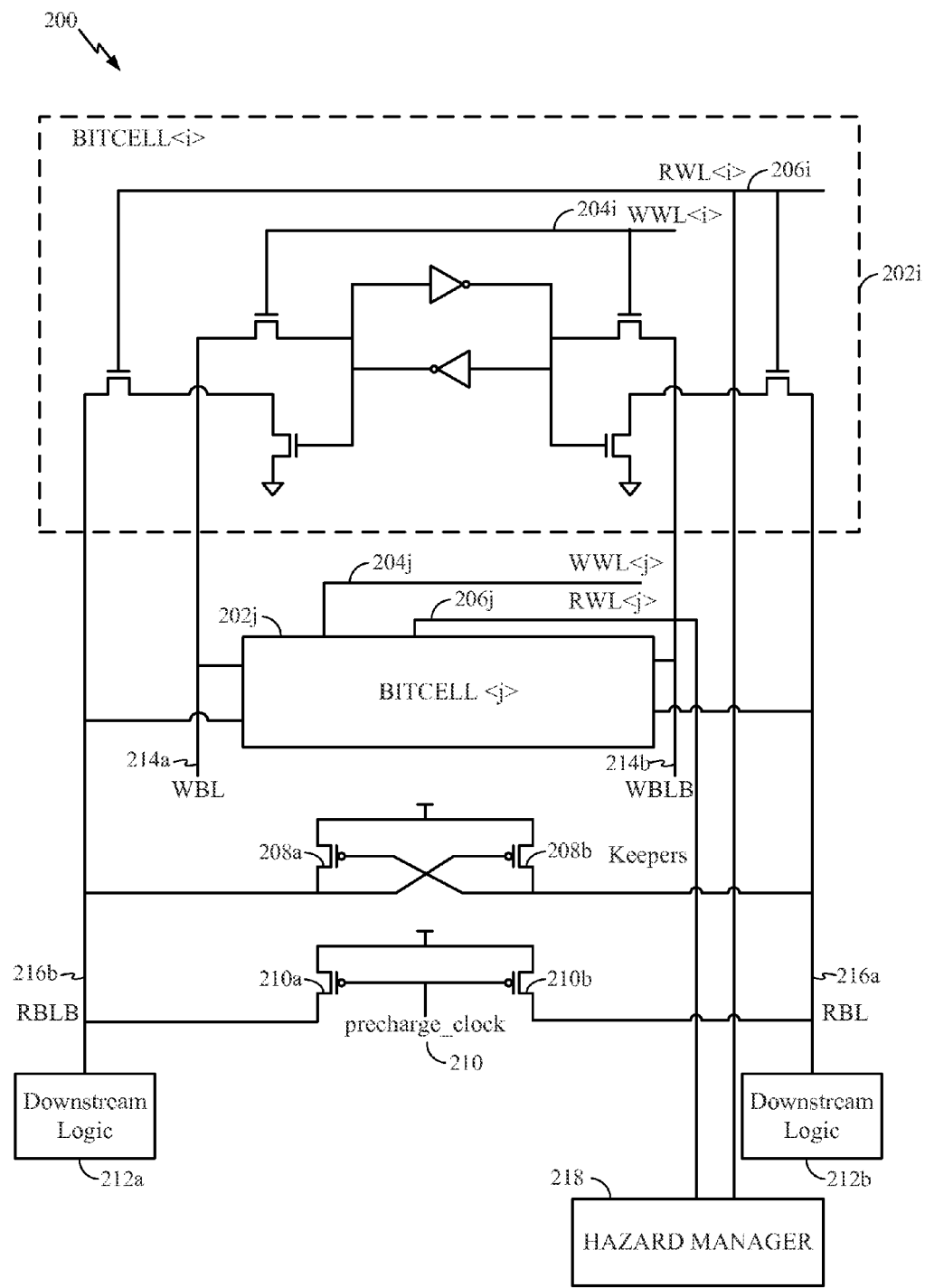
FIG. 2 is an exemplary SRAM array with cross-coupled bitline keepers and exemplary hazard management logic to prevent crowbar current.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary embodiments are directed to systems and methods for preventing crowbar currents from arising in fully differential arrays, such as SRAM arrays, during a situation where a simultaneous read and write operation is attempted to the same bit cell. With reference to FIG. 1B, this situation is illustrated with regard to a timing diagram that relates to the conventional SRAM array 100 of FIG. 1A discussed above. As shown, during the phase or time duration Tc of pre-charge clock 110, both RWL 106$i$ and WWL 104$i$ are high, pursuant to the same address "i" corresponding to bit cell 102$i$ being driven on both the read address bus 106 and write address bus 104. This situation will cause complementary bitlines RBL 116$a$ and RBLB 116$b$ to float or transition to an undefined state, which will lead to crowbar current to flow through downstream logic 112$a$-$b$ of FIG. 1A.

Exemplary embodiments can be configured to avoid the above-described problem of conventional SRAM array 100, for example, by utilizing the fact that RWL, 106$j$, corresponding to bit cell 102$j$ remains low during the problematic time period Tc. More particularly, with regard to memory arrays such as SRAM arrays which implement cross-coupled bitline keepers, exemplary embodiments may be configured to avoid a read-write collision on a bit cell or memory entry by performing a dummy read on an alternative bit cell or memory entry. As discussed herein, a "read-write collision" pertains to simultaneously scheduled read and write operations on a same memory entry, such as a cache line or a word line or a bit cell. In general, embodiments will be discussed with regard to read-write collision on a bit cell, and skilled persons will be able to extend disclosed techniques to any memory entry or entries without departing from the scope of the embodiments.

With reference to FIG. 2, exemplary SRAM array 200 is illustrated. In several aspects, SRAM array 200 is similar to conventional SRAM array 100 of FIG. 1A. However, in addition to similar components of SRAM array 100, SRAM array 200 comprises hazard management logic, depicted as hazard manager 218, configured for detecting read-write collisions and suppressing crowbar current by exemplary techniques. For the sake of completeness, the similar aspects between SRAM array 100 and SRAM array 200 will be first enumerated, and a detailed description of the additional components and other exemplary aspects pertaining to read-write collision detection and crowbar current suppression in SRAM array 200 will be provided in the following sections.

Similar to FIG. 1A, in FIG. 2, SRAM array 200 includes bit cells 202i, 202j, etc, each configured as a ten transistor (10T) SRAM cell, in one non-limiting configuration. It will be understood that embodiments can be easily extended to other configurations of the SRAM cells without departing from the scope of this disclosure. Write word lines WWL 204i and WWL 204j are enabled (i.e. driven to a high voltage level or logic state) for write operations on corresponding bit cells 202i and 202j. The data to be written is supplied by complementary write bitlines WBL 214a and WBLB 214b. Similarly, read word lines RWL 206i and RWL 206j are enabled for read operations on corresponding bit cells 202i and 202j, and the read data is read out of the corresponding bit cells on complementary read bitlines RBL 216a and RBLB 216b. Transistors 210a-b are used to provide pre-charge clock 210 to SRAM array 200. Cross-coupled bitline keepers 208a and 208b are provided to accelerate the operations on the bit cells. For example, to enable faster reading of bit cells during operations such as tag compares, cross-coupled bitline keepers 208a-b are provided, to mitigate delays in the critical path. As previously, in the absence of exemplary hazard manager 218, if simultaneous read and write operations were allowed to take place on the same bit cell, for example, bit cell 202i by enabling both WWL 204i and RWL 206i, cross-coupled bitline keepers 208a-b can be driven to a meta-stable state and complementary read bitlines RBL 216a and RBLB 216b can be caused to float, which could create a harmful and undesirable crowbar (or short-circuit) current to flow through downstream logic 212a-b. However, the implementation of hazard manager 218, in conjunction with other exemplary aspects, will prevent the above scenario from occurring, by detecting read-write collisions or simultaneous read and write operations to the same bit cell, and suppressing the read operation and allowing the write operation to proceed. Additionally, a dummy read operation is performed on another bit cell, as described below.

Figure 3:
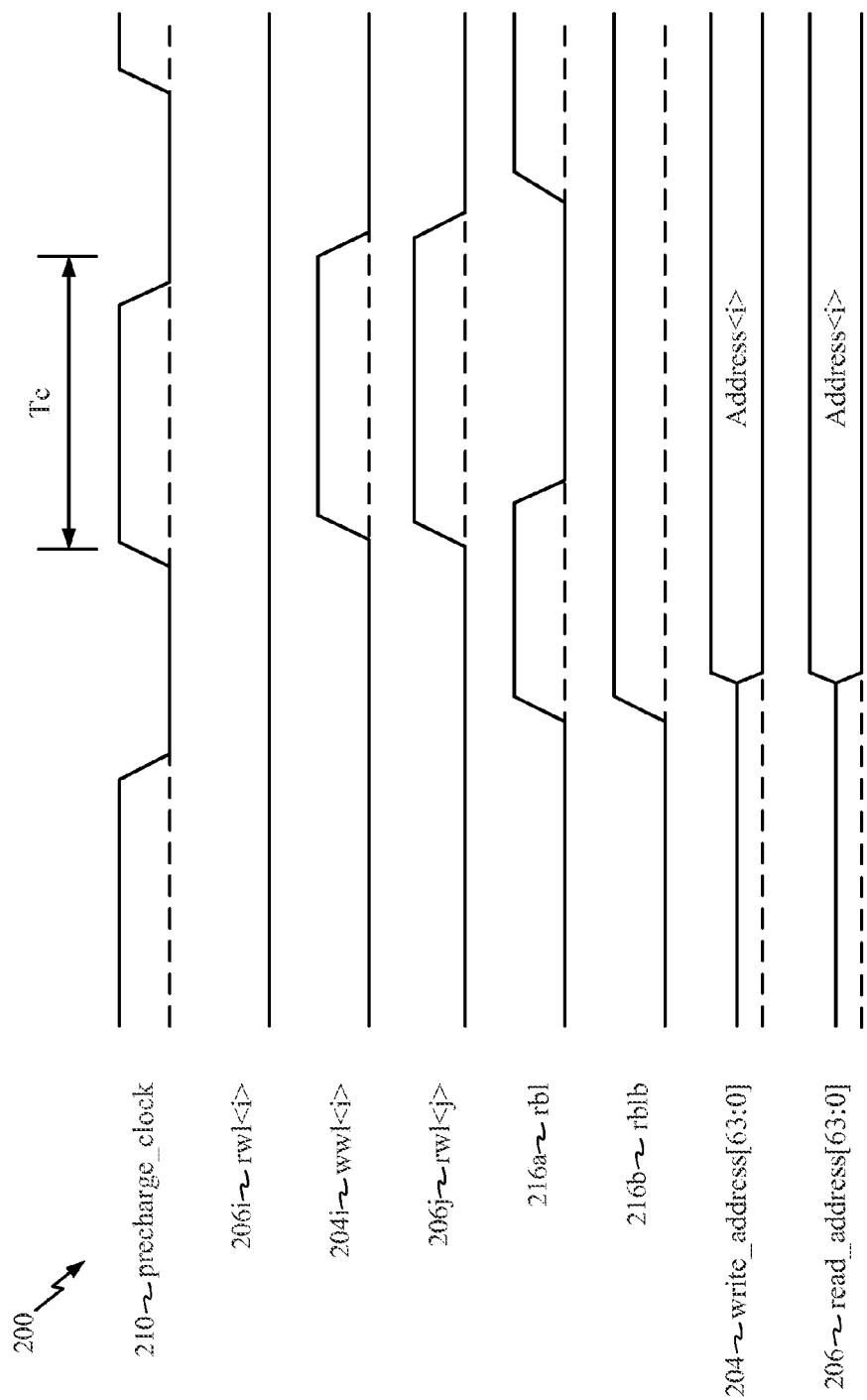
FIG. 3 is the timing diagram corresponding to the exemplary SRAM array of FIG. 2.

Referring to FIG. 3, an exemplary timing diagram is illustrated, corresponding, for example, to the exemplary SRAM array 200 of FIG. 2. As shown in FIG. 3, a situation similar to the timing diagram of FIG. 1B can arise for SRAM array 200, and more specifically, at phase Tc of pre-charge clock 210. Here, read address bus 206 and write address bus 204 can point to the same address "i" (e.g. corresponding to a bit cell, such as bit cell 202i), which could potentially enable both read and write word lines RWL 206i and WWL 204i going high at the same time during phase Tc. However, exemplary techniques can prevent that from happening by alternative causing the read word line RWL 206j for address "j" (e.g. corresponding to a bit, cell, such as bit cell 202j) to be enabled instead of RWL 206i. In one example, hazard manager 218 can include corresponding circuitry/logic for detecting a collision based on a simultaneous read and write operation to a first entry at address "i" and eliminating floating state of read bitlines RBL 216a and RBLB 216b. Hazard manager 218 may be further configured to prevent bitline discharge current from read bitlines RBL 216a and RBLB 216b from leading to crowbar current by enabling a different read word line and redirecting the bitline discharge current to a second entry at address "j". Accordingly, the read word line RWL 206i is suppressed and the read word line corresponding to RWL 206j is enabled, in order to perform a dummy read at the second entry at address "j" instead. Thus, the problematic situation can now be averted, and a dummy read operation can be performed at the address j, while the write operation proceeds undisturbed to address i. As a result, corresponding complementary read bitlines RBL 216a and RBLB 216b will evaluate to complementary logic states as shown, and no crowbar current will be generated.

It will be understood that in exemplary embodiments, not only is RWL 206i suppressed from being enabled, but the alternative read word line RWL 206j is enabled, in order to redirect bitline discharge current (i.e. current related to the originally intended read operation from read bitlines RBL 216a and/or RBLB 216b) from related read circuitry or source into an alternative sink (e.g. RWL 206j). This combination of suppressing the original read and performing a dummy read is necessary to prevent crowbar current. In conventional approaches for handling read-write hazards, a crowbar current may nevertheless arise because the original read and write word lines may nevertheless be enabled or a suitable channel to redirect related current may be missing. Accordingly, exemplary embodiments go beyond merely resolving a conflict or read-write hazard, and ensure that crowbar current is also prevented.

Accordingly, in SRAM array 200 when a read-write collision is detected for an entry, for example, a first entry, the write to the first entry may be allowed to proceed undisturbed. However, hazard manager 218 may modify read word line logic for the first entry, such that when the read-write collision is detected, an alternative, second read word line is enabled. The second read word line being enabled or active high can retain cross-coupled bitline keepers 208a-b in a normal operating state without entering a meta stable state, and thereby prevent the complementary bitlines from floating and causing undesirable crowbar currents. In some embodiments, the second read word line may be adjacent to or corresponding to a sequential entry as the first read word line. In some embodiments, the second read word line can correspond to any entry in a different word line from that of the first entry. Regardless of which one of the above embodiments is chosen, t le crowbar currents can be eliminated because at least one read word line is activated and the cross-coupled bitline keepers are retained in a normal state. Activating the second read word line in this manner corresponds to a dummy read and correspondingly no meaningful read data is obtained from the dummy read.

With reference now to FIGS. 4A-D, an exemplary implementation of hazard manager 218 is illustrated. As illustrated, hazard manager 218 may be easily introduced or added on in an otherwise conventional SRAM array design, such as SRAM array 100 without significant alterations to the array design, in order to obtain the configuration of exemplary SRAM array 200. Accordingly, exemplary techniques can be introduced in existing memory arrays without major design alterations and at a low cost. Moreover, it will also be understood that while hazard manager 218 is illustrated as standalone logic, the functionality therein can also be easily integrated into read-write circuitry, or any other logic or functional block related to exemplary SRAM array 200 without departing from the scope of this disclosure. It will also be noted that while hazard manager 218 is only shown to affect read word lines RWL 206*i* and 206*j*, for the sake of clarity, many other connections, such as inputs, and outputs pertaining to hazard manager 218 are left out of the schematic illustration in FIG. 2. However, with reference to FIGS. 4A-D, the various connections, such as exemplary inputs and outputs pertaining to hazard manager 218 will become apparent to one skilled in the art.

Figure 4:
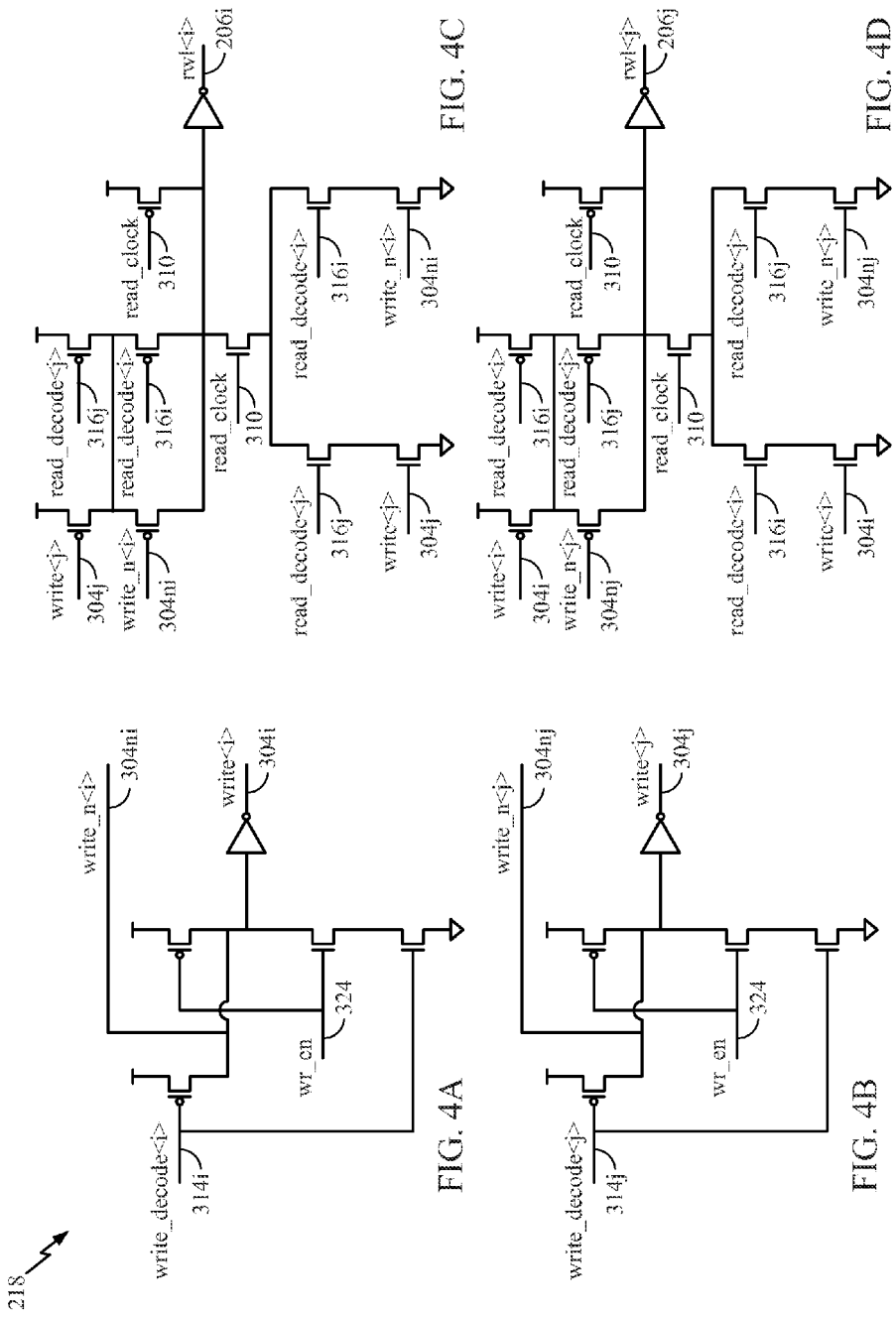
FIGS. 4A-D illustrate a detailed view of the hazard management logic of FIG. 2, configured for detecting and preventing crowbar current.

Accordingly, in more detail, FIG. 4A illustrates logic in hazard manager 218 pertaining to write operations for a row or address "i" of exemplary SRAM array 200. Write decode 314*i* and write enable 324 are inputs, for example, related to writing an exemplary bit cell or memory entry at address "i" (e.g. bit cell 202*i*). In some implementations, write decode 314*i* will be active or in a high logic state when a write decoder (not shown) decodes a write address as address "i" and write decode 314*i* thus generated will be logically ANDed with write enable 324 (as shown). True and complementary outputs of write decode 314*i* logically ANDed with write enable 324 are generated as write 304*i* and write_n 304_ni respectively. In other words, the write logic implemented by FIG. 4A can be represented by the logical function: write_n 304*ni*=~(write enable 324 & write_decode 314*i*); and write 304*i*=(write enable 324 & write_decode 314*i*). While not specifically illustrated, the write logic implemented by FIG. 4A can be used for enabling or disabling write word line WWL 204*i*.

Similarly, as shown in FIG. 4B write logic for an exemplary bit cell at address "j" (e.g. bit cell 202*j*), write_decode 314*j* logically ANDed with write enable 324 generates true and complementary outputs write 304*j* and write_n 304*nj*. In other words, the write logic in FIG. 4B can be represented by the logical function: write_n 304*nj*=~(write enable 324 & write_decode 314*j*); and write 304*j*=(write enable 324 & write_decode 314*j*). Once again, while not specifically illustrated, the write logic implemented by FIG. 4B can be used for enabling or disabling write word line WWL 204*j*.

Similar to write operations, FIGS. 4C-D represent logic in hazard manager 218 corresponding to read operations for addresses "i" and "j" (e.g. bit cells 202*i* and 202*j*) respectively. A read decoder (not shown), generates the signals, read decode 316*i* and 316*j*. In the illustrated embodiment, read clock 310 includes functionality of a read enable such that read clock 310 going active high can be used as an enable signal for read operations. FIG. 4C illustrates logic configured to ensure that read word line RWL 206*i* corresponding to address "i" does not get enabled or transition to active high when there is a read-write collision for a bit cell at address "i", but on the other hand, can get enabled if there is a read-write collision on address "j". In order to implement the above functionality, RWL 206*i* can be enabled if there is no read-write collision on address "i," for example, by implementing read_clock 310 & ((read decode 316*i* & write_n 304*ni*). Additionally, detection logic can be configured to detect simultaneous read and write operation to a bit cell or entry at address "j," for example, by implementing read_clock 310 & (read decode 316*j* & write 304*j*). Correspondingly for address "j," suppression logic (e.g. read clock 310 & (read decode 316*j* & write_n 304_nj, see FIG. 4D) can suppress the read operation to the bit cell or entry at address "j" if a simultaneous read and write operation is detected. Accordingly, read logic can be configured, according to the circuit of FIG. 4C, to implement a dummy read operation on an alternative or second bit cell or entry at address "i", for example, by implementing the combined illustrated function: RWL 206*i*=read_clock 310 & ((read decode 316*i* & write_*n* 304*ni*)|(read decode 316*j* & write 304*j*)). p In the illustration of FIG. 4D, a related, and in a sense, converse operation, is shown for read and write collisions for address "j", wherein, when read word line RWL 206*j* corresponding to address "j" does not get enabled or transition to active high when there is a read-write collision for a bit cell at address "j" (e.g. bit cell 202*j*), but on the other hand, can get enabled if there is a read-write collision on address "i". In order to implement the above functionality, RWL 206*j* can be enabled if there is no read-write collision on address "j," for example, by implementing read_clock 310 & ((read decode 316*j* & write_n 304*nj*). Additionally, detection logic can be configured to detect simultaneous read and write operation to a bit cell or entry at address "i," for example, by implementing read_clock 310 & (read decode 316*i* & write 304*i*). Correspondingly for address "i," suppression logic (e.g. read_clock 310 & (read decode 316*i* & write_n 304*ni*), see FIG. 4C) can suppress the read operation to the bit cell or entry at address "i" if a simultaneous read and write operation is detected. Accordingly, read logic can be configured, according to the circuit of FIG. 4D, to implement a dummy read operation on an alternative or second bit cell or entry at address "j", for example, by implementing the combined illustrated function: RWL 206*j*=read_clock 310 & ((read decode 316*j* & write_n 304*nj*)|(read decode 316*i* & write 304*i*)).

However, it will be kept in mind that the illustrated converse relationship in FIGS. 4C-D explained above, is relative to only some embodiments, and is not a necessary feature. In alternative embodiments, a different read word line, say corresponding to yet another address "x" (not illustrated) of SRAM array 200 can be driven to active high when a read-write collision occurs on address "j". Accordingly, RWL 206*j* can be enabled for read-write collisions on address "i", and RWL 206*x* (not shown) can be enabled for read-write collisions on address "j" and so on. Accordingly, in general, SRAM array 200 can comprise a first entry/bit cell (e.g. at address "i") and a second entry/bit cell (e.g. at address "j"), wherein cross-coupled bitline keepers are coupled to the first bit cell and the second bit cell. The detection logic (e.g. FIGS. 4C-D) can be configured to detect a simultaneous read and write operation to the first bit cell, and the suppression logic (e.g. FIGS. 4C-D) can be configured to suppress the read operation to the first bit cell if a simultaneous read and write operation to the first bit cell is detected. Further, as shown in FIGS. 4C-D, read logic can be configured to perform a dummy read operation to the second bit cell. Moreover, as shown in FIGS. 4A-B, the write logic can be configured to perform the write operation to the first bit cell. Additionally, as will be understood from the above discussion, references are made to exemplary bit cells in a particular row or address, in order to illustrate the exemplary techniques. However, skilled persons will recognize that disclosed techniques are not limited by the number of bit cells or memory entries which may be present in a particular row or word line or address in the memory array, but may be generally extended to any row size with any number of corresponding bit cells or memory entries. Accordingly, the various techniques are described with references to the terms bit cells/memory entries and rows/word lines/addresses used interchangeably in some aspects.

In general, if SRAM array 200 comprises 2N entries or rows with 2N addresses, then read-write collision logic can be implemented in N pairs of first and second read word lines (e.g. RWL 206*i* and RWL 206*j* correspond to one pair in the illustrated example).

Figure 5:
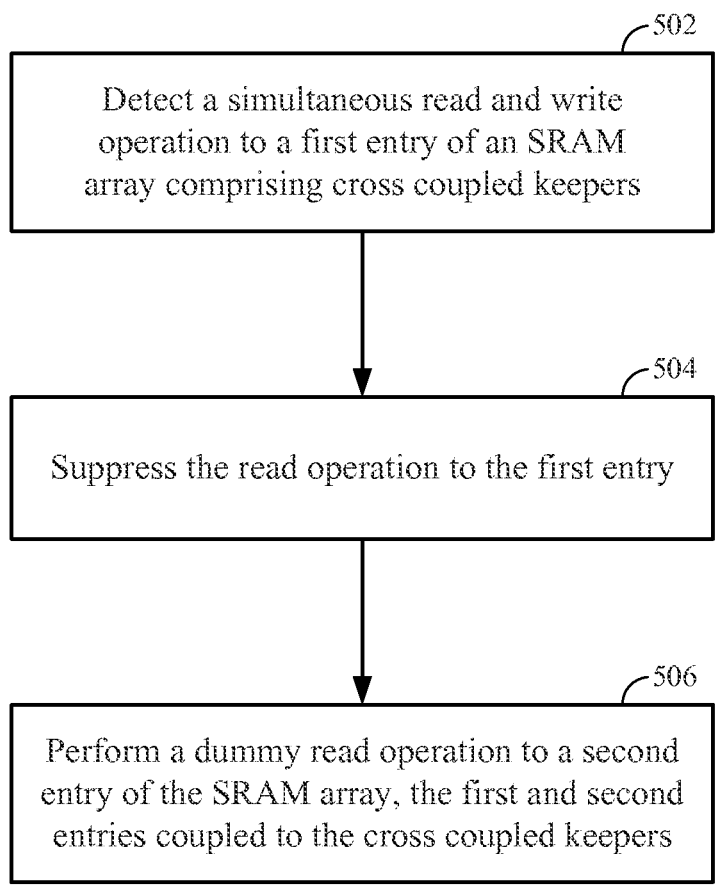
FIG. 5 illustrates a flowchart corresponding to a method of detecting and preventing crowbar current in an exemplary SRAM array.

It will be appreciated that embodiments include various methods for performing the processes, functions and/or algorithms disclosed herein. For example, as illustrated in FIG. 5, an embodiment can include a method of preventing crowbar current in a static random access memory (SRAM) array (e.g. SRAM array 200) comprising cross-coupled bitline keepers (e.g. 208a-b), the method comprising: detecting a simultaneous read and write operation (e.g. detection logic corresponding to address "i") to a first entry of the SRAM array (e.g. bit cell 202i)—Block 502; suppressing the read operation to the first entry (e.g. suppression logic corresponding to address "i") Block 504; and performing a dummy read operation (e.g. read logic corresponding to address "j") to a second entry (e.g. bit cell 202j at address "j") of the SRAM array, the first and second entries coupled to the cross-coupled bitline keepers—Block 506.

Figure 6:
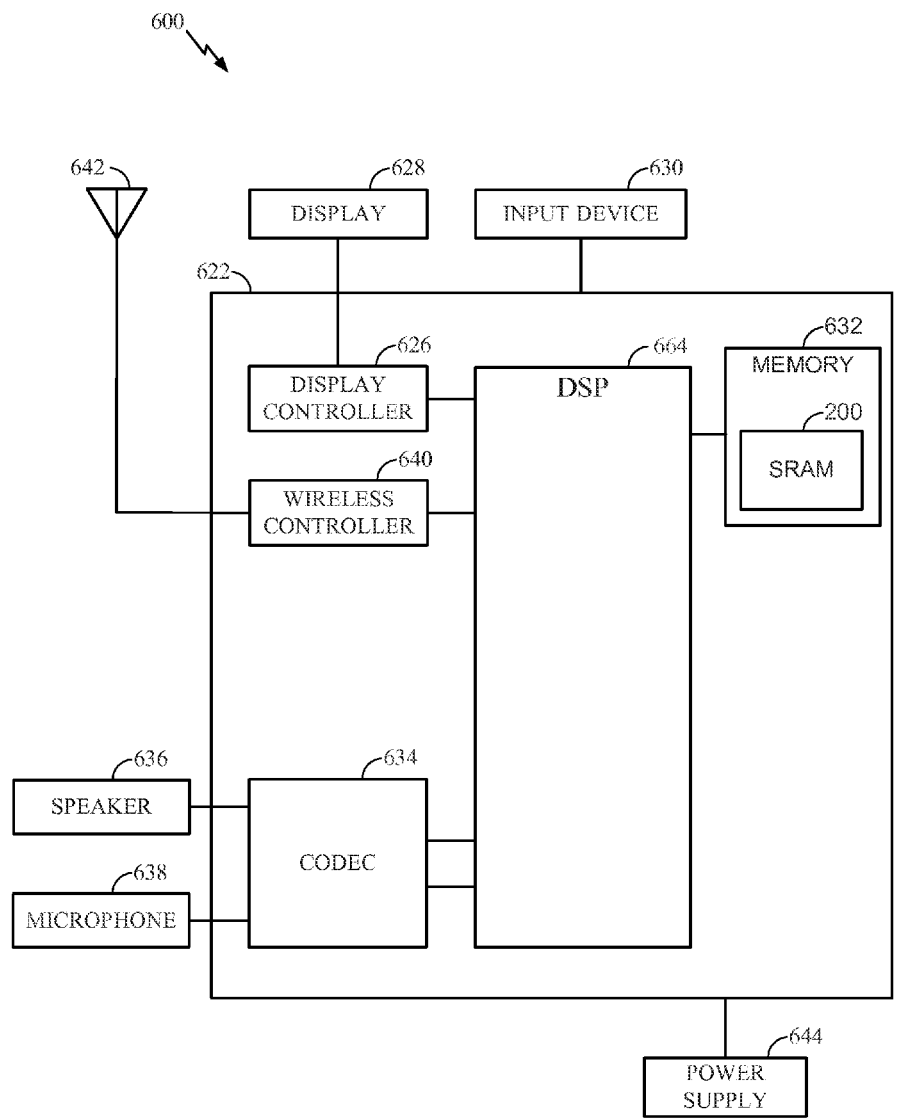
FIG. 6 illustrates an exemplary implementation of a wireless communication device configured for detection and prevention of crowbar current in an exemplary SRAM array.

With reference now to FIG. 6, an embodiment of device 600 configured as a wireless communication device is illustrated. As shown, device 600 includes digital signal processor (DSP) 664. DSP 664 may be coupled to memory 632, which may include exemplary SRAM array 200 configured according to exemplary embodiments (although not shown in this view, in some embodiments, SRAM array 200 may be part of or built into DSP 664). Display controller 626 can be coupled to DSP 664 and to display 628. Coder/decoder (CODEC) 634 (e.g., an audio and/or voice CODEC) can be coupled to DSP 664. Other components, such as wireless controller 640 (which may include a modem) are also illustrated. Speaker 636 and microphone 638 can be coupled to CODEC 634. FIG. 6 also indicates that wireless controller 640 can be coupled to wireless antenna 642. In a particular embodiment, DSP 664, display controller 626, memory 632, CODEC 634, and wireless controller 640 are included in a system-in-package or system-on-chip device 622.

In a particular embodiment, input device 630 and power supply 644 are coupled to the system-on-chip device 622. Moreover, in a particular embodiment, as illustrated in FIG. 6, display 628, input device 630, speaker 636, microphone 638, wireless antenna 642, and power supply 644 are external to the system-on-chip device 622. However, each of display 628, input device 630, speaker 636, microphone 638, wireless antenna 642, and power supply 644 can be coupled to a component of the system-on-chip device 622, such as an interface or a controller. p In one embodiment, DSP 664 and/or memory 632, in conjunction with one or more remaining components illustrated in FIG. 6, can include logic or means, such as hazard manager 218, to detect and prevent crowbar current in an exemplary SRAM array comprising cross-coupled bitline keepers and included in memory 632, according to the method discussed in Blocks 502-506 of FIG. 5. For example, DSP 664 and/or memory 632 can include logic similar to that of hazard manager 218 illustrated in FIGS. 4A-D, and accordingly, can detect a simultaneous read and write operation to a first entry of the SRAM array, suppress the read operation to the first entry, and perform a dummy read operation to a second entry of the memory array, wherein the first and second entries coupled to the cross-coupled bitline keepers.

It should be noted that although FIG. 6 depicts a wireless communications device, DSP 664 and memory 632 may also be integrated into a set-top box, a music player, a video player, an entertainment unit, a navigation device, a communications device, a personal digital assistant (PDA), a fixed location data unit, or a computer. A processor (e.g., DSP 664) may also be integrated into such a device. Moreover, such a device may also be integrated in a semiconductor die.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for implementing a dummy read to prevent crowbar currents during read-write collisions in memory arrays. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of preventing crowbar current in a static random access memory (SRAM) array, the method comprising:
   detecting a simultaneous read and write operation to a first bit cell of the SRAM array, the first bit cell coupled to at least first and second cross-coupled bitline keepers through at least first and second read bitlines;
   suppressing the read operation to the first bit cell; and
   performing a dummy read operation to a second bit cell of the SRAM array, the second bit cell coupled to at least the first and second cross-coupled bitline keepers through the first and second read bitlines.

2. The method of claim 1, wherein performing the dummy read operation prevents at least the first and second cross-coupled bitline keepers from entering a meta-stable state.

3. The method of claim 1, wherein performing the dummy read operation prevents at least the first and second read bitlines from floating.

4. The method of claim 1, comprising allowing the write operation to the first-bit cell to proceed.

5. The method of claim 1, wherein bit-line discharge current related to the read operation to the first bit cell is redirected to the dummy read operation to the second bit cell.

6. The method of claim 1, wherein the first bit cell is adjacent to the second bit cell.

7. A static random access memory (SRAM) array comprising:
- a first bit cell coupled to at least first and second cross-coupled bitline keepers through at least first and second read bitlines;
- a second bit cell coupled to at least the first and second cross-coupled bitline keepers through at least the first and second read bitlines;
- detection logic configured to detect a simultaneous read and write operation to the first bit cell;
- suppression logic configured to suppress the read operation to the first bit cell if a simultaneous read and write operation to the first bit cell is detected; and
- read logic configured to perform a dummy read operation to the second bit cell.

8. The SRAM array of claim 7, wherein the detection logic, the suppression logic, and the read logic are further configured to prevent at least the first and second cross-coupled bitline keepers from entering a meta-stable state.

9. The SRAM array of claim 7, wherein the detection logic, the suppression logic, and the read logic are further configured to prevent at least the first and second read bitlines from floating.

10. The SRAM array of claim 7, wherein the detection logic, the suppression logic, and the read logic are further configured to redirect bitline discharge current related to the read operation to the first bit cell to the dummy read operation related to the second bit cell.

11. The SRAM array of claim 7, further comprising write logic configured to perform the write operation to the first bit cell.

12. The SRAM array of claim 7, wherein the first bit cell is adjacent to the second bit cell.

13. A system comprising:
- a static random access memory (SRAM) array comprising:
  - a first bit cell coupled to at least first and second cross-coupled bitline keepers through at least first and second read bitlines; and
  - a second bit cell coupled to at least the first and second cross-coupled bitline keepers through at least the first and second read bitlines;
- means for detecting a simultaneous read and write operation to the first bit cell;
- means for suppressing the read operation to the first bit cell; and
- means for performing a dummy read operation to the second bit cell.

14. The system of claim 13, comprising means for preventing at least the first and second cross-coupled bitline keepers from entering a meta-stable state.

15. The system of claim 13, comprising means for preventing at least the first and second read bitlines from floating.

16. The system of claim 13, comprising means for allowing the write operation to the first bit cell to proceed.

17. The system of claim 13, comprising means for redirecting bitline discharge current related to the read operation related to the first bit cell to the dummy read operation related to the second bit cell.

* * * * *